United States Patent
Zhang et al.

(10) Patent No.: US 8,900,990 B2
(45) Date of Patent: Dec. 2, 2014

(54) SYSTEM AND METHOD OF COMBINING DAMASCENES AND SUBTRACT METAL ETCH FOR ADVANCED BACK END OF LINE INTERCONNECTIONS

(71) Applicants: STMicroelectronics, Inc., Coppell, TX (US); International Business Machines Corporation, Armonk, NY (US)

(72) Inventors: John H. Zhang, Fishkill, NY (US); Lawrence A. Clevenger, LaGrangeville, NY (US); Carl Radens, LaGrangeville, NY (US); Yiheng Xu, Hopewell Junction, NY (US); Walter Kleemeier, Fishkill, NY (US); Cindy Goldberg, Cold Spring, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/731,878

(22) Filed: Dec. 31, 2012

(65) Prior Publication Data

US 2014/0183735 A1 Jul. 3, 2014

(51) Int. Cl.
*H01L 21/4763* (2006.01)
*H01L 21/44* (2006.01)
*H01L 21/768* (2006.01)
*H01L 23/538* (2006.01)

(52) U.S. Cl.
CPC ...... *H01L 21/76877* (2013.01); *H01L 23/5384* (2013.01)
USPC ........... 438/622; 438/629; 438/637; 438/667; 438/672; 438/675; 438/700

(58) Field of Classification Search
CPC ..................... H01L 23/5226; H01L 21/76802; H01L 21/76807; H01L 21/823871; H01L 21/76843; H01L 21/76877
USPC ......... 438/629, 637, 639, 640, 667, 672, 675, 438/700, 701, 713, 118, 622, 627, 643, 653
See application file for complete search history.

(56) References Cited

U.S. PATENT DOCUMENTS

| | | | |
|---|---|---|---|
| 7,394,144 B2 * | 7/2008 | Rochefort et al. | 257/522 |
| 8,592,895 B2 * | 11/2013 | Yilmaz et al. | 257/330 |
| 2007/0167000 A1 * | 7/2007 | Wood et al. | 438/629 |
| 2010/0072543 A1 * | 3/2010 | Hsieh | 257/331 |
| 2012/0098073 A1 * | 4/2012 | Yu et al. | 257/413 |

* cited by examiner

*Primary Examiner* — Matthew Reames
*Assistant Examiner* — Dilinh Nguyen
(74) *Attorney, Agent, or Firm* — Seed IP Law Group PLLC

(57) ABSTRACT

Metal interconnections are formed in an integrated by combining damascene processes and subtractive metal etching. A wide trench is formed in a dielectric layer. A conductive material is deposited in the wide trench. Trenches are etched in the conductive material to delineate a plurality of metal plugs each contacting a respective metal track exposed by the wide trench.

11 Claims, 12 Drawing Sheets

SYSTEM AND METHOD OF COMBINING DAMASCENES AND SUBTRACT METAL ETCH FOR ADVANCED BACK END OF LINE INTERCONNECTIONS

BACKGROUND

1. Technical Field

The present disclosure relates to the field of integrated circuit design. The present disclosure relates more particularly to metal interconnections within an integrated circuit die.

2. Description of the Related Art

As integrated circuit technology continues to scale down to smaller technology nodes, the back end of the line connections become very challenging and complicated to implement. Complex patterning schemes such as double patterning are used to provide smaller and smaller interconnection features. Many problems can occur within the integrated circuits as vias and metal lines within the integrated circuit become smaller and closer together. These problems can include difficulty in alignment of photolithography masks during manufacture, as well as electromigration and time dependent dielectric breakdown during the life of the integrated circuit.

BRIEF SUMMARY

One embodiment is a method for forming metal interconnections in an integrated circuit die. First metal tracks are formed from a first metal layer on a substrate of an integrated circuit die. An intermetal dielectric layer is formed on the substrate and the first metal tracks.

The intermetal dielectric layer is then patterned and etched to form a wide trench in the intermetal dielectric layer exposing the first metal tracks. A conductive material is deposited in the wide trench in contact with the first metal tracks. The conductive material is etched to form trenches therein. The trenches delineate conductive plugs from the conductive material. The conductive plugs are electrically isolated from each other by the trenches. Each conductive plug contacts a respective first metal track.

DETAILED DESCRIPTION

Figure 1:
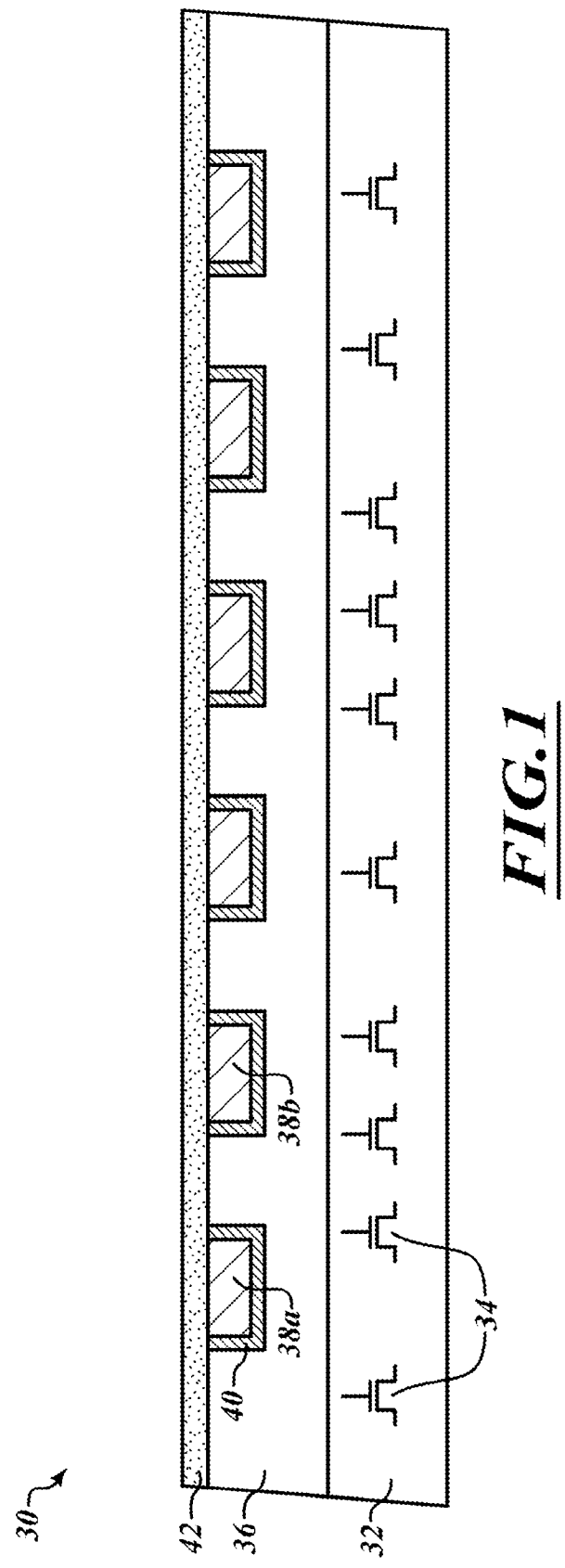
FIG. 1 is a cross section of an integrated circuit die according to one embodiment.

FIG. 1 is a cross section of an integrated circuit die 30 including a semiconductor substrate 32 and a dielectric layer 36. Transistors 34 are formed in the substrate 32. First metal tracks 38a and 38b are formed on the substrate 32. Each metal track 38a, 38b is lined by a thin barrier layer 40. The first metal tracks 38a and 38b and the dielectric layer 36 are covered in a dielectric capping layer 42. While six first metal tracks are illustrated in FIG. 1, only two of the first metal tracks, 38a and 38b, are numbered herein.

The dielectric layer 36 is shown as a single layer in FIG. 1, however in practice the dielectric layer 36 can include conductive and dielectric layers set on top of the semiconductor substrate 32 in which transistors 34 are formed. Though not illustrated, additional metal tracks, vias, and signal lines may be formed in dielectric layers below the dielectric layer 36. The first metal tracks 38a and 38b are conductive signal carrying lines which allow signals to be passed through the integrated circuit die 30, including to the transistors 34 and to metal contacts outside the integrated circuit die 30, such as contact pads, solder balls, or leads. In the integrated circuit die 30 as illustrated in FIG. 1, there may be many components not illustrated which are below the first metal tracks 38a and 38b of the first metal layer.

In one embodiment the substrate 32 includes silicon dioxide layers, low K dielectric layers, silicon nitride layers, or other suitable dielectric layers on the semiconductor substrate 32. The semiconductor substrate 32 is for example silicon or another suitable semiconductor layer in and on which transistors 34 can be formed.

In one example the first metal tracks 38a and 38b are formed of copper. The barrier layer 40 is one or more layers of titanium, titanium nitride, tantalum, tantalum nitride or other suitable barrier layers. The first metal tracks 38a and 38b are, for example, 60-100 nm in thickness. The first metal tracks 38a and 38b are separated by 32 nm, 20 nm, or any suitable distance depending on the technology node and minimum dimensions being implemented.

In many integrated circuits the metal tracks are formed of aluminum or aluminum copper due to difficulties in processing copper lines and vias. However, as the technology nodes decrease to smaller and smaller dimensions, copper is preferred for metal tracks and vias in integrated circuit dies due to high conductivity and other parameters. However, any suitable metal may be used for the metal tracks, vias, and barrier layers.

The capping layer 42 is, for example, silicon nitride or preferably a silicon nitride layer including carbon. The capping layer 42 and is between 200-500 Å thick. Other suitable materials and dimensions may be used for the features described in FIG. 1.

Figure 2:
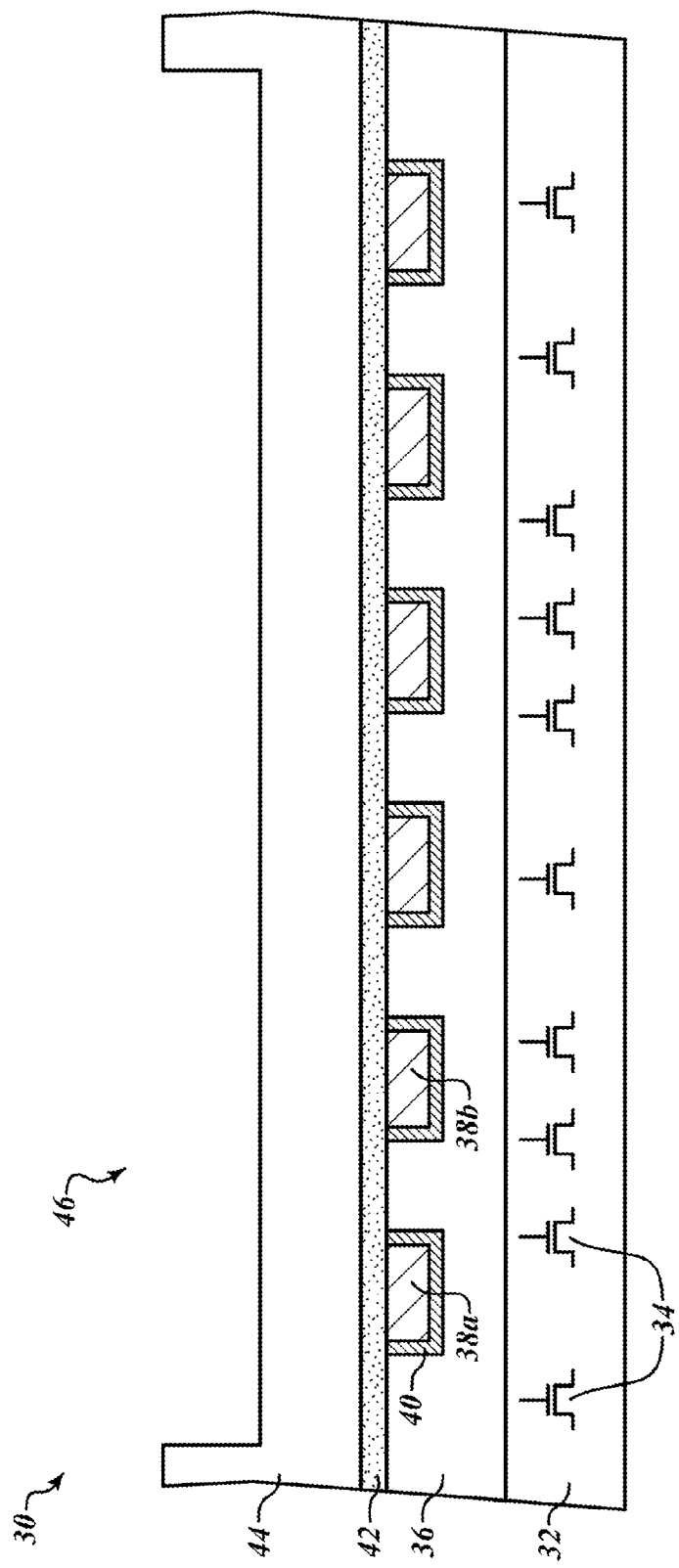
FIG. 2 is a cross section of an integrated circuit die in which a first trench has been formed in a first intermetal dielectric layer according to one embodiment.

In FIG. 2, a first intermetal dielectric layer 44 has been deposited on the capping layer 42. The first intermetal dielectric layer 44 is, for example, a nanoporous dielectric layer between 600-1500 Å in thickness. As dimensions in the features of integrated circuits continue to shrink, the capacitance between conductive features of the integrated circuits begins to increase. For example, the capacitance between metal tracks formed in an integrated circuit die 30 or between metal tracks and vias formed in an integrated circuit die 30 increases as the distance between the features decreases. The capacitance between the conductive features of the integrated circuit is also proportional to the dielectric constant of the material between them. For this reason, the first intermetal dielectric layer 44 is a low K dielectric layer. This means that the dielectric constant of the intermetal dielectric layer 44 is comparatively small. This helps to reduce the capacitance between features formed in or on or under the first intermetal dielectric layer 44. The intermetal dielectric layer 44 can be, for example, a porous dielectric, such as porous silicon dioxide or other porous material. Alternatively, the first intermetal dielectric layer 44 can be a material other than a porous dielectric layer, but still formed of a material having a very low dielectric constant.

Figure 3:
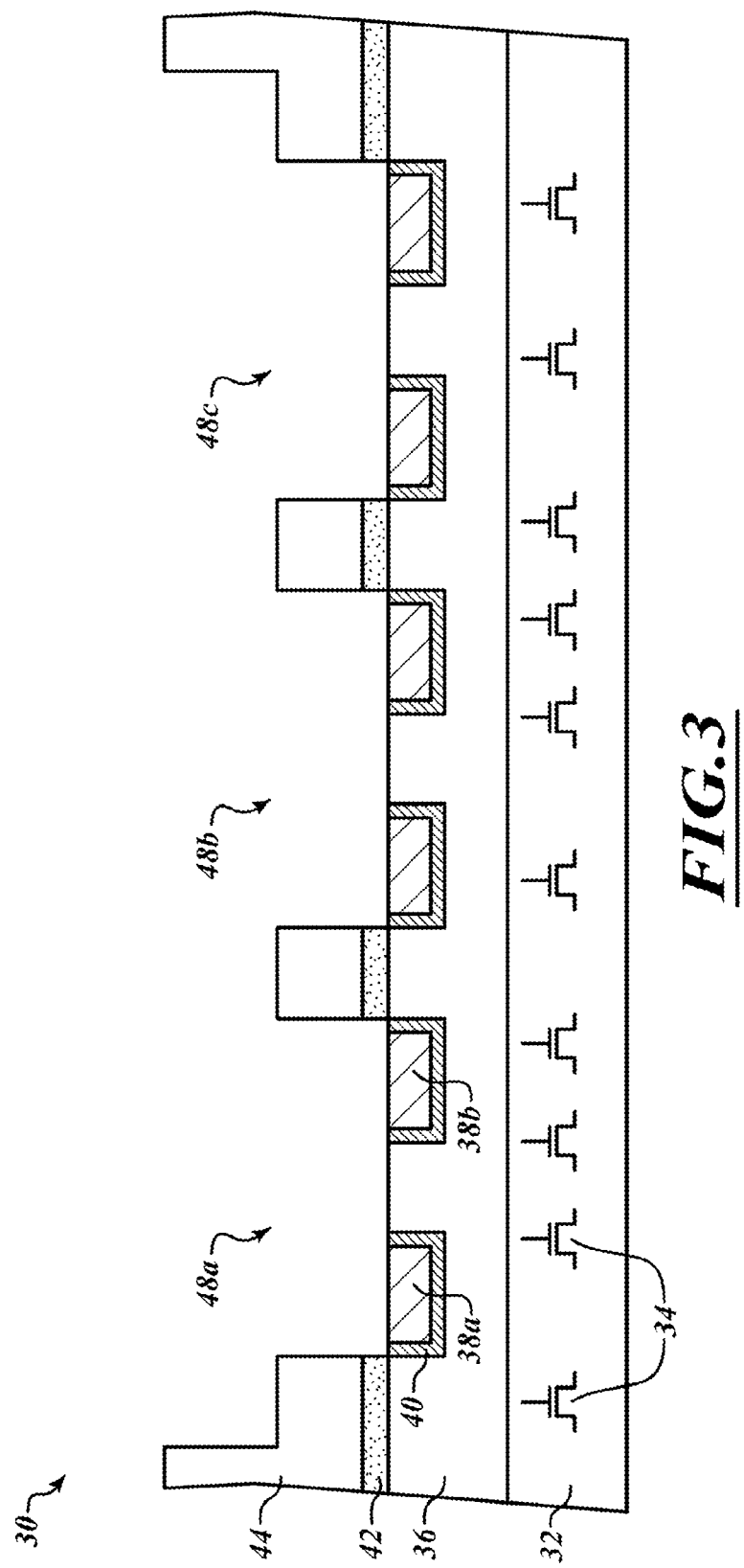
FIG. 3 is a cross section of an integrated circuit die in which further trenches have been opened in the first trench according to one embodiment.

In FIG. 3, the first intermetal dielectric layer 44 is patterned and etched to open trench 46 in the first intermetal dielectric layer 44. The first intermetal dielectric layer 44 is not etched all the way to the capping layer 42. Instead, the intermetal dielectric layer 44 is etched using a time-based control to selectively etch to a certain depth. The depth of the trench 46 in FIG. 3 is, for example, 600 Å. The trench 46 in the first intermetal dielectric layer 44 can be opened by using a reactive ion etch. The time-based control which controls the depth of the reactive ion etch is, for example, a step height advanced process control. Such an advanced process control allows the etch to go to a particular depth without going further. Many other suitable dimensions for the trench 46 can be selected according to the desired parameters of the integrated circuit die 30. Furthermore, etching techniques other than those described can be used to achieve the same or similar results, as desired.

Figure 4:
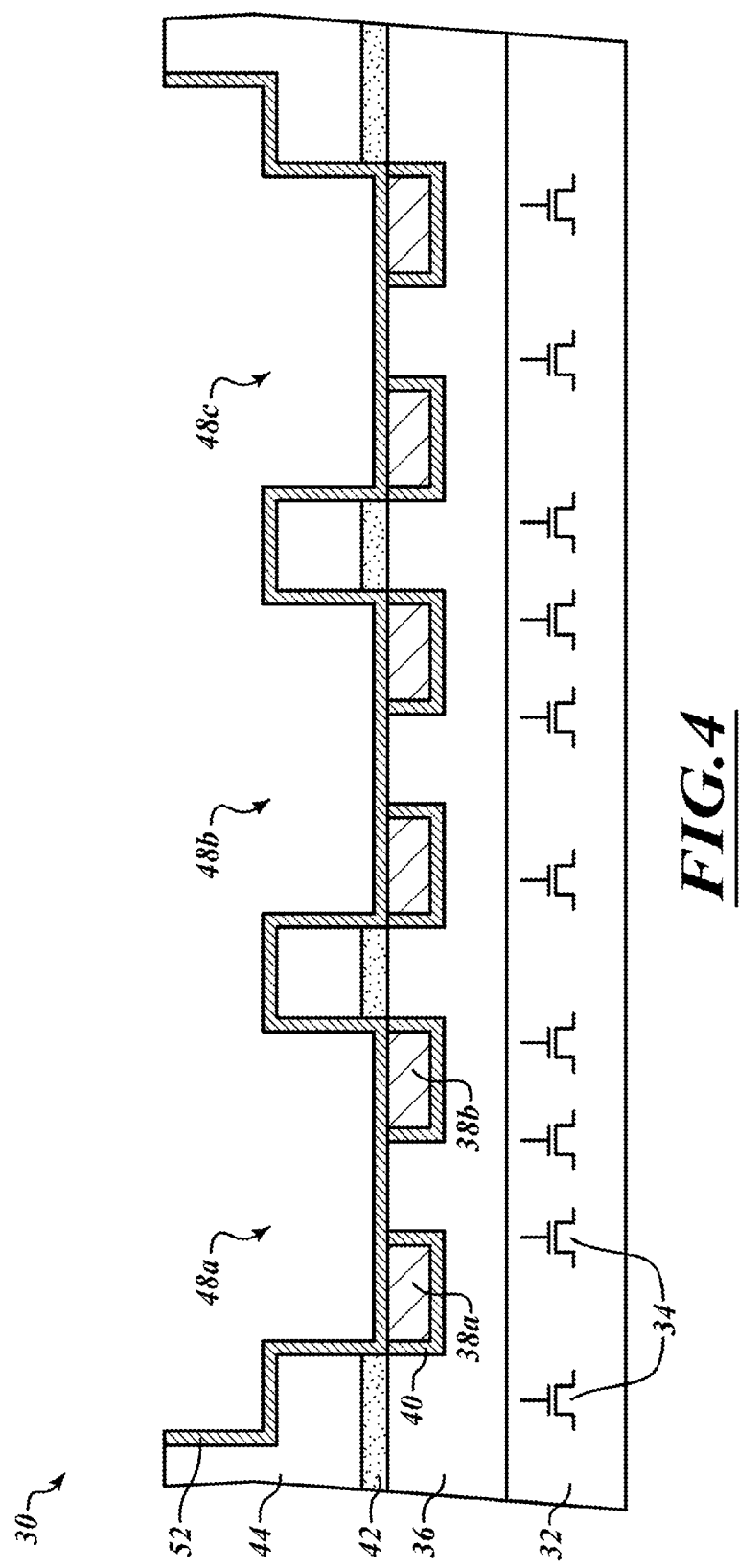
FIG. 4 is a cross section of an integrated circuit die having a barrier layer deposited in the trenches to one embodiment.

In FIG. 4, a thin barrier layer 52 is deposited on the protective dielectric layer 42 and in the trench 46. The barrier layer 52 provides a barrier to keep mobile metal atoms from a metal track from entering dielectric layers. The barrier layer also acts as an adhesive layer for a subsequently deposited metal layer. The barrier layer 52 is, for example, one or more layers of titanium, titanium nitride, tantalum, or tantalum nitride. Alternatively, other suitable materials can be used to form the barrier layer 52. When Ti and/or TiN are used, the barrier layer 52 is, for example, 4-20 Å thick. When Ta and/or TaN are used for the barrier layer 52, the barrier layer 52 is, for example, 60 Å thick. Of course other suitable thicknesses and materials can be used.

Figure 5:
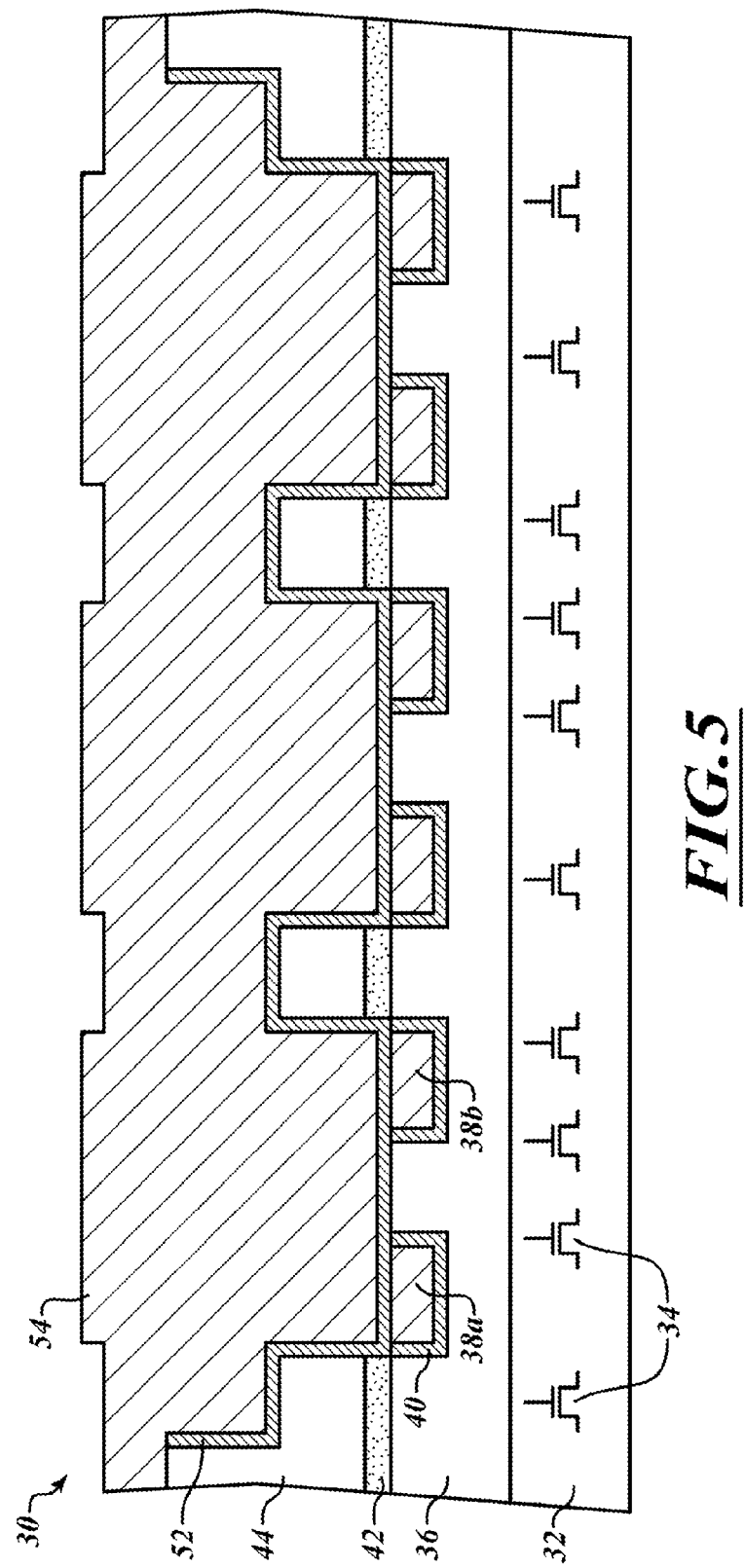
FIG. 5 is a cross section of an integrated circuit die having a conductive material filling the trenches according to one embodiment.

In FIG. 5, a thick layer of conductive material 54 is deposited on the barrier layer 52 and in the trench 46. The conductive layer 54 fills the trench 46 and extends above the upper surface of the first intermetal dielectric layer 44. The conductive material 54 is in direct contact with the barrier layer 52.

The conductive material 54 is, in this example, copper. However, other suitable materials can be used for the conductive material 54. The conductive material can be formed using an electroplating and electroless process. In particular, the conductive material 54 can be deposited by first depositing a very thin copper seed layer in a physical vapor deposition (PVD) process. The seed layer is, for example, 10 nm thick. This is followed by an electroplating process that deposits a copper layer about 400 nm thick. Other suitable processes can be used to deposit the conductive material 54.

Figure 6:
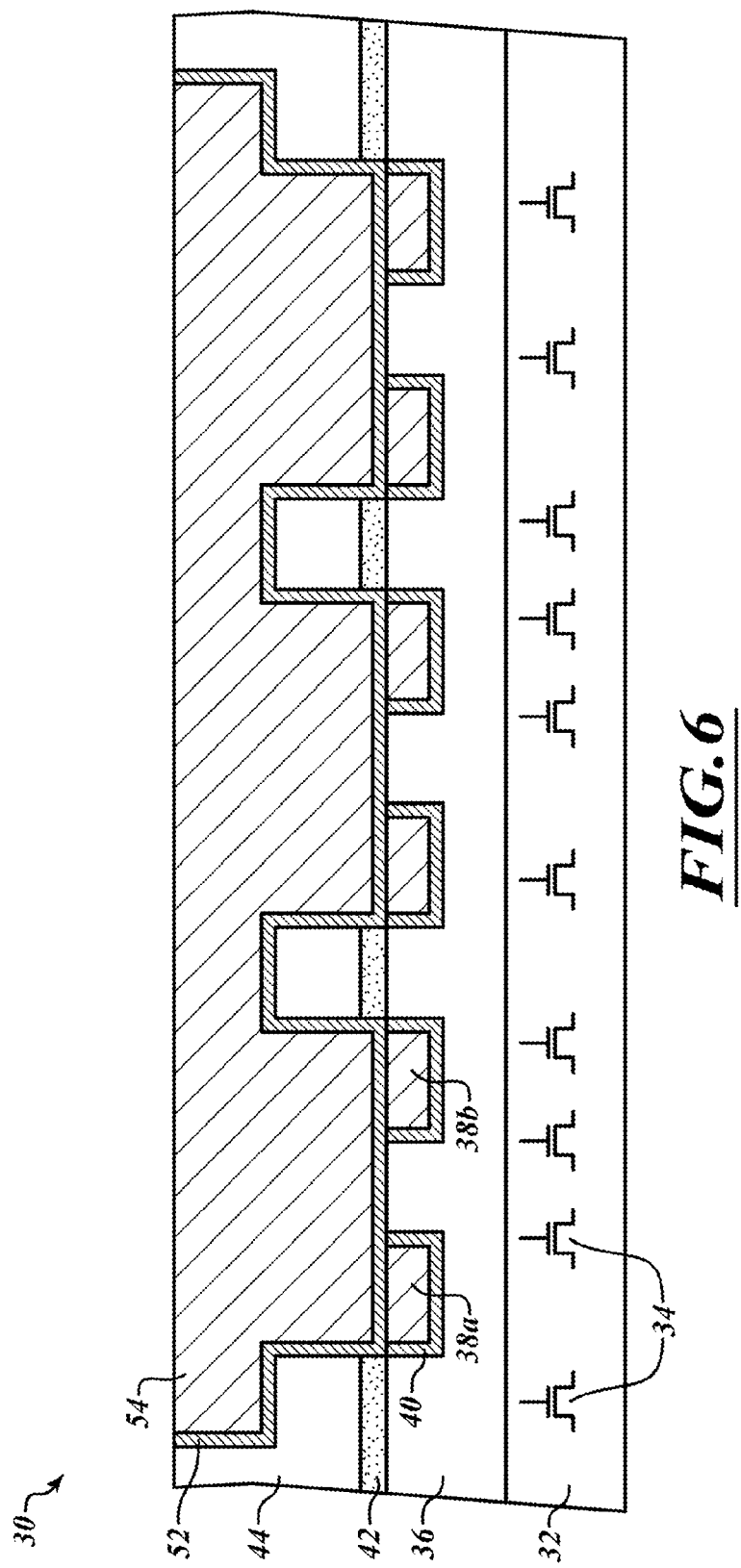
FIG. 6 is a cross section of an integrated circuit die the conductive material has been planarized according to one embodiment.

In FIG. 6, a planarization step has been performed to remove excess conductive material from the protective dielectric layer 42. The planarization step is, for example, a chemical mechanical planarization step configured to stop on the protective dielectric layer 42.

Figure 7A:
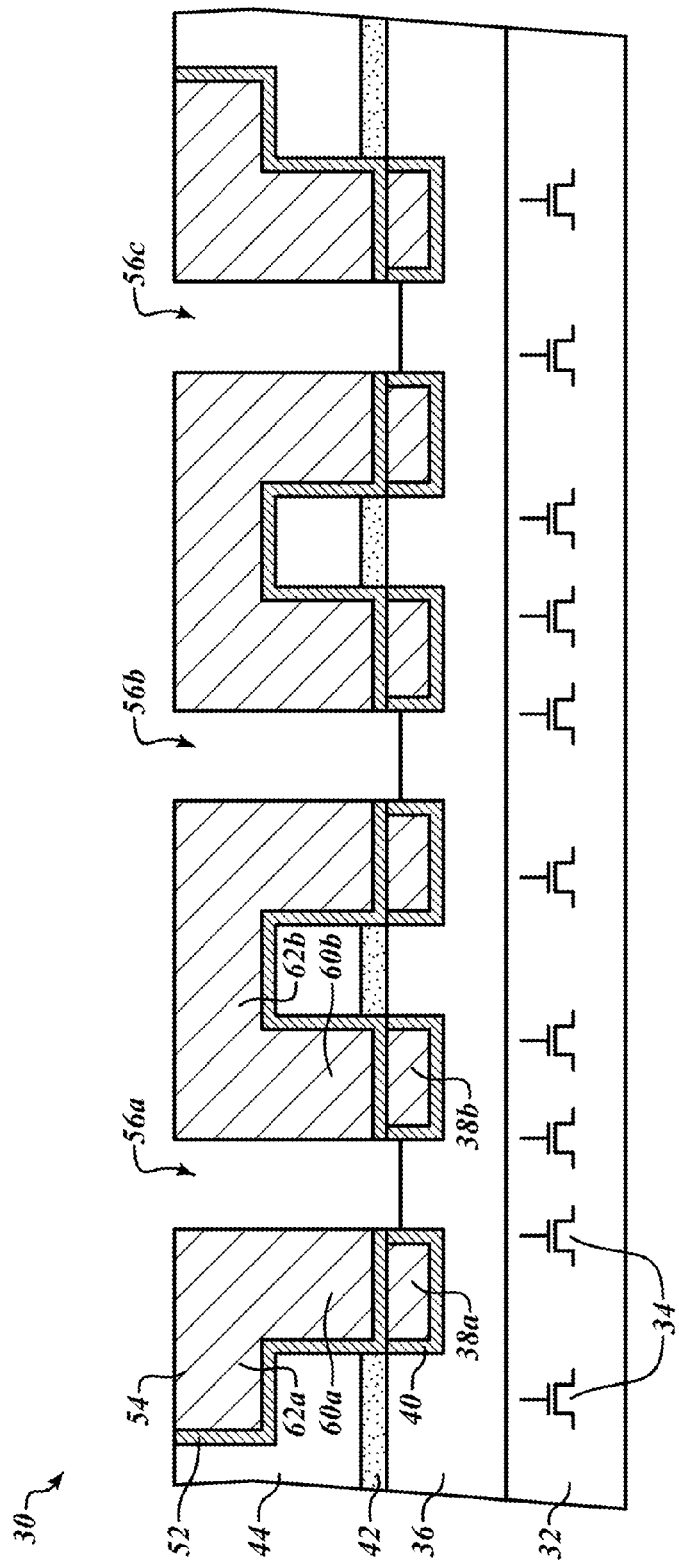
FIG. 7A is a cross section of an integrated circuit die having third trenches etched in the conductive material delineating metal plugs according to one embodiment.

In FIG. 7A, the conductive material 54 has been etched to form trenches 56a, 56b, and 56c. The trenches 56a, 56b, and 56c extend through the conductive material 54 and the barrier layer 52 to expose the dielectric layer 36. In one example the trenches 56a, 56b, and 56c are formed using photolithography techniques to form a patterned mask of photoresist on the conductive material 54 and the intermetal dielectric layer 44. A reactive ion etch is then performed to etch the conductive material 54 at locations exposed by the patterned mask. The reactive ion etch etches through the conductive material 54 and the barrier layer 52. The reactive ion etch stops when the dielectric layer 36 has been exposed. A small amount of the dielectric layer 36 may also be etched before the reactive ion etch is stopped, as shown in FIG. 7A. In one example the trenches 56a, 56b, and 56c are 32 nm wide, but the trenches can be 56a, 56b, and 56c can be 10-50 nm wide.

The trenches 56a, 56b, and 56c electrically isolate respective portions of the conductive material 54 from each other. In particular, the trenches 56a, 56b, and 56c define a plurality of conductive plugs 60a and 60b and second metal tracks 62a and 62b. The conductive plugs 60a and 60b contact respective first metal tracks 38a and 38b. The conductive plugs 60a and 60b are electrically connected to the respective first metal tracks 38a and 38b. The conductive plugs 60a and 60b are integral with respective second metal tracks 62a and 62b. The conductive plug 60a therefore electrically connects the first metal track 38a to the second metal track 62a. The conductive plug 60b electrically connects the first metal track 38b with the first metal track 62b. Though not specifically numbered in FIG. 7A, further conductive plugs connect respective first metal tracks to respective second metal tracks.

The first metal tracks 38a and 38b, and the second metal tracks 62a and 62b are conductive signal carrying lines which allow signals to be passed through the integrated circuit die 30, including to the transistors 34 and to metal contacts outside the integrated circuit die 30, such as contact pads, solder balls, or leads. While first metal tracks are described as being formed of the first metal layer and the second metal tracks 62a and 62b are described as being formed in the second metal layer, it is understood that other metal layers below the first metal tracks may be present. The first metal tracks 38a and 38b, the conductive plugs 60a and 60b, the second metal tracks 62a and 62, and other metal interconnections in the integrated circuit die allow connection between transistors 34 formed in the semiconductor substrate and with components outside the integrated circuit die 30. In this manner electric signals can be passed throughout the integrated circuit die 30.

In one example the conductive plugs 60a and 60b, as well as the second metal tracks 62a and 62b are formed of copper. In many integrated circuits the metal tracks are formed of aluminum or aluminum copper due to difficulties in processing copper lines and vias. However, as the technology nodes decrease to smaller and smaller dimensions, copper is preferred for metal tracks and vias in integrated circuit dies due to high conductivity and other parameters. Any suitable metals and other materials may be used for the metal tracks, vias, and barrier layers.

The second metal tracks 62a and 62b are, for example, 60-100 nm in thickness. The trenches 56a, 56b, and 56c are for example 20 nm wide, or any suitable width depending on the technology node and minimum dimensions being implemented.

The formation of the conductive plugs 60a and 60b and the second metal tracks 62a and 62b as described in relation to FIGS. 1-7 combines damascene and subtractive metal processes for advanced back end of line interconnections. This provides several benefits.

The conductive plugs 60a and 60b and the second metal tracks 62a and 62b formed according to principles of the present disclosure have many benefits over previous designs.

Because the conductive material 54 is deposited in comparatively wide trenches 48a, 48b, and 48c as disclosed in FIGS. 3 and 4, larger copper grains are formed. As the grain size of the copper in the conductive material 54 increases, the conductivity and reliability of the interconnect structures increases. In some processes for forming metal interconnections from copper, the copper is deposited into very narrow trenches and other features formed in dielectric layers. Because the copper is deposited in comparatively narrow, the grain size of the copper is comparatively small. If grain size becomes too small, then the interconnect structures formed therefrom can suffer from decreased reliability in carrying electrical signals, and can even fail entirely. However, in a process according to principles of the present disclosure, the conductive material 54 is deposited in relatively wide features, allowing for formation of larger copper grains. Metal interconnections subsequently formed from the conductive material 54 can have improved electrical characteristics compared to features having smaller copper grain sizes.

In previous methods for forming metal interconnections from copper, the metal interconnection structures have suffered from low reliability due to poor step coverage in the copper liner that is often put down prior to forming the copper interconnect structures. In particular, prior to forming copper plugs and tracks, it is common for a very thin seed layer of copper to first be deposited. The copper seed layer is typically deposited by a very slow physical vapor deposition process that allows the thin copper seed layer to form on all of the surfaces inside of small trenches and other features in which the thicker copper layer will be deposited. As the size of the metal interconnections decreases according to the smaller technology nodes, reliability of total step coverage by the seed layer decreases. Sometimes the seed layer is not formed properly on all surfaces within trenches having very high aspect ratios. The thicker copper layer that is subsequently formed on the seed layer may form incompletely within the trenches having high aspect ratios. If the thicker copper layer within these trenches forms poorly due to the poor step coverage of the seed layer, then the metal interconnections may not function properly, and electrical signals may not be passed reliably through the integrated circuit die 30.

However, metal interconnections formed according to principles of the present disclosure do not suffer from these same drawbacks. In particular, because the conductive material 54 is formed in very wide trenches 48a, 48b, and 48c as shown in FIG. 3, the problem of poor step coverage of the seed layer in trenches having high aspect ratios is alleviated. The conductive material 54 instead forms fully and properly within the trenches 48a, 48b, and 48c. Thus the physical and electrical characteristics of metal interconnections formed from the conductive material 54 according to principles of the present disclosure are more robust, and do not suffer from the drawbacks described previously.

A further benefit of forming metal interconnections according to principles of the present disclosure is that the number of critical masks can be reduced. For example, in previous processes for forming metal interconnections having very small features, highly accurate mask alignment is needed. Typically, contact vias were formed by etching a high aspect ratio via in a dielectric material to expose narrow metal tracks below. Because the metal tracks are relatively small, even a small misalignment of the mask used to form the trenches can cause fatal misalignment of the vias with the metal tracks. Oftentimes double lithography etches are used to meet the alignment requirements in prior processes. This can be very complicated and challenging, and can lead to much higher costs of manufacturing integrated circuits and decreased reliability of the integrated circuits.

However, interconnections formed according to principles of the present disclosure do not suffer from these same drawbacks. In particular, as shown in FIG. 6, the conductive material 54 deposited in the aforedescribed wide trenches 48a, 48b, and 48c, is in full electrical contact with the first metal tracks 38a and 38b. Trenches can be formed as shown in FIG. 7A having relaxed photolithography requirements. Because the trenches 56a, 56b, and 56c do not need to expose very thin metal tracks, the photolithography requirements can be relaxed. The trenches 56a, 56b, and 56c etched directly into the conductive material 54 need only electrically isolate the conductive plugs 60 and 60b from each other. As long as the trenches 56a, 56b, and 56c are not so misaligned as to cause one conductive plug to erroneously contact two first metal tracks, the photolithographic requirements have been met.

Alignment steps requiring very high accuracy are among the most expensive processes in integrated circuit manufacturing. The more strict the photolithographic requirements are, the more costly the alignment steps are. In the process according to principles of the present disclosure as illustrated in relation to FIGS. 1-7A, relaxed photolithographic standards can be used. This can reduce the cost of manufacturing the integrated circuit die 30, and can increase reliability of the integrated circuit die 30. Additionally, the conductive plugs 60a and 60b, and the second metal tracks 62a and 62b, are defined in a single etch step. This further reduces the number of masks required to process the integrated circuit die 30.

While the conductive material 54 has been described as being copper, other conductive materials can be used. In particular, aluminum, a combination of copper and aluminum, gold, aluminum, tungsten, or other suitable conductive materials can be used to form metal interconnections.

Figure 7B:
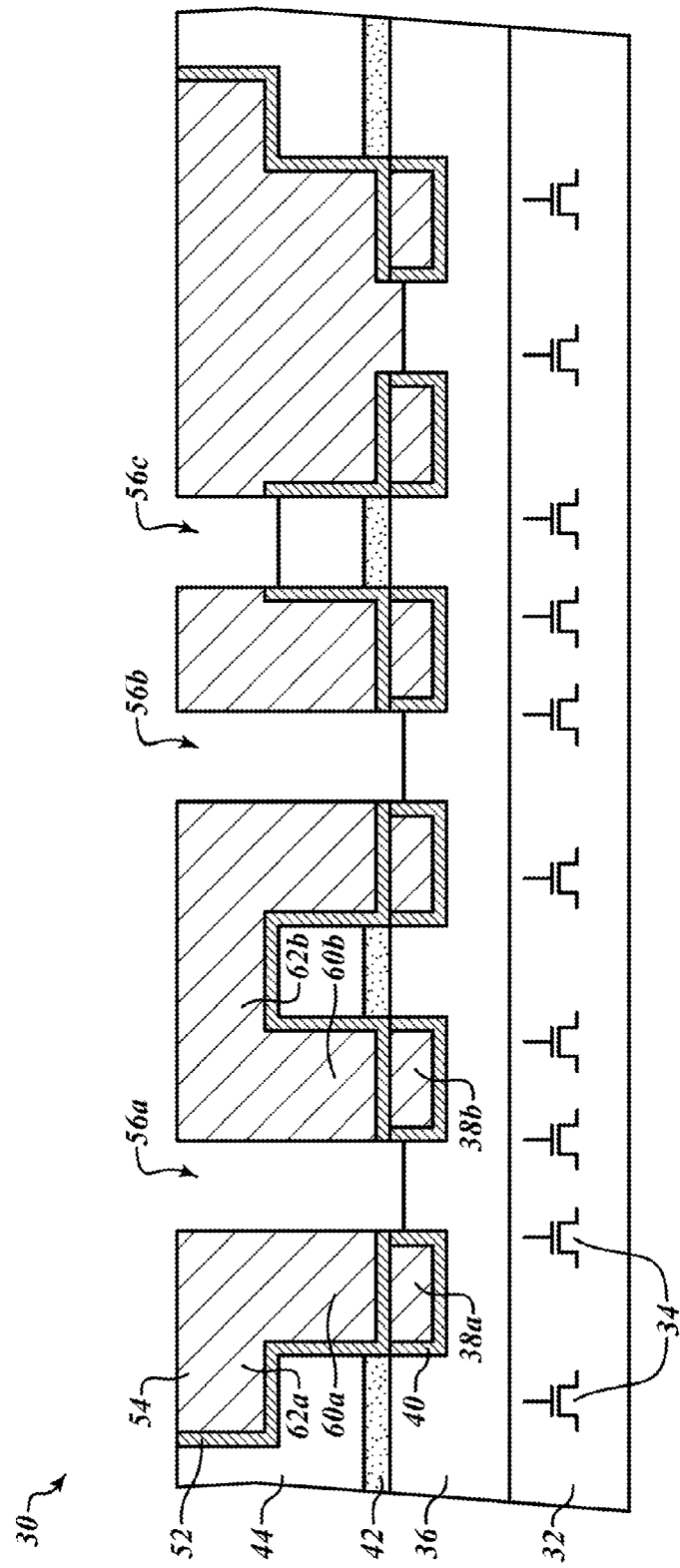
FIG. 7B is a cross section of an integrated circuit die having third trenches etched in the conductive material delineating metal plugs according to an alternative embodiment.

FIG. 7B illustrates an alternative embodiment in which trench 56c is formed on the raised portion of the intermetal dielectric layer 44. This illustrates that trenches can be formed in the conductive material in different ways than shown in FIG. 7A. Many other patterns for forming trenches in the conductive material 54 are possible as will be apparent to those of skill in the art in light of the present disclosure.

Figure 8:
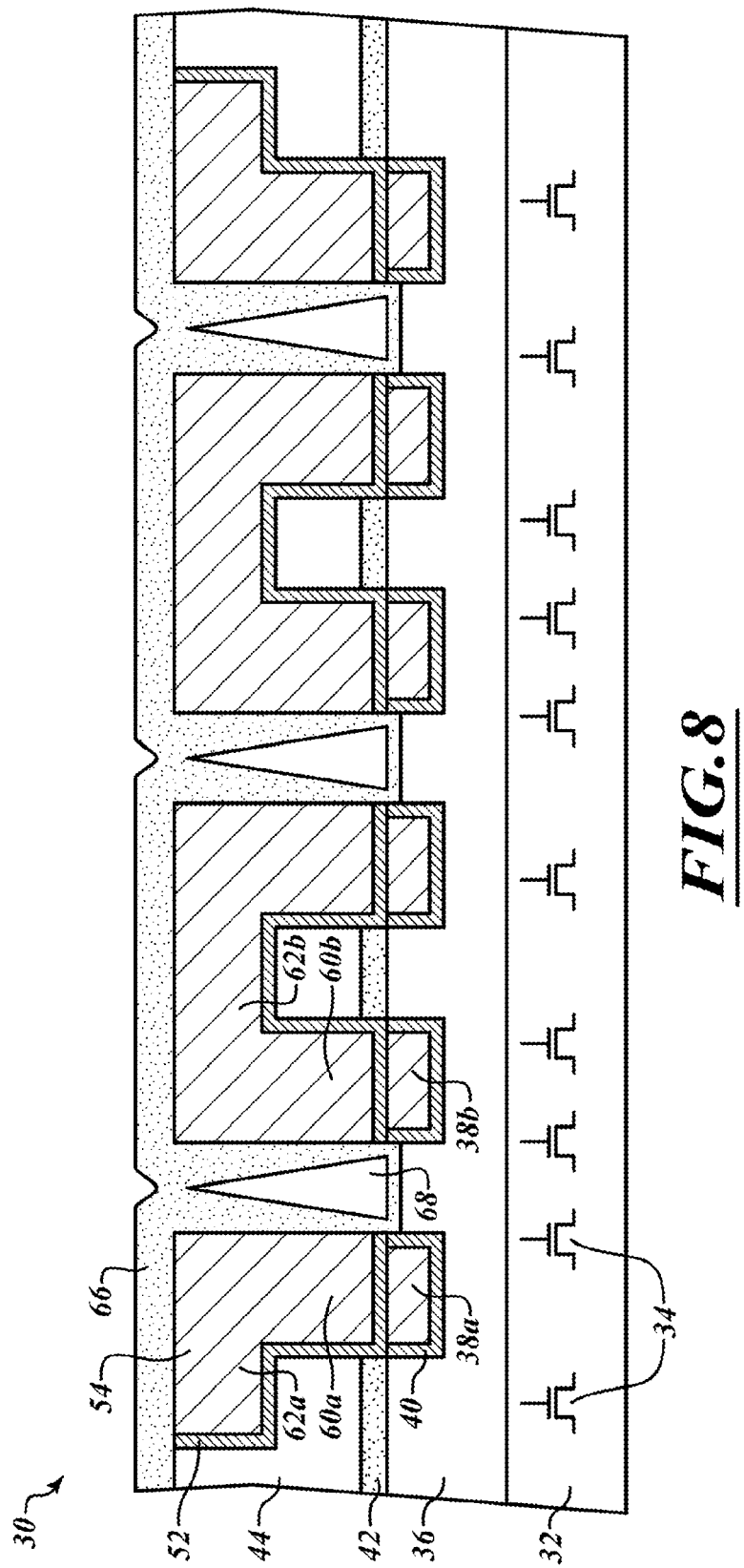
FIG. 8 is a cross section of an integrated circuit die after a protective dielectric layer has been formed on the metal plugs and on the sidewalls of the third trenches according to one embodiment.

In FIG. 8, an encapsulating dielectric material 66 is formed on the second metal tracks 62a and 62b, and in trenches 56a, 56b, and 56c. In particular, the encapsulating dielectric material 66 is formed on the sidewalls of the trenches 56a, 56b, and 56c. A hollow space 68 is left in the trenches 56a, 56b, and 56c. This is because during deposition of the encapsulating dielectric material 66, the dielectric material accumulates more quickly near the top of the trenches 56a, 56b, and 56c. After the top of the trenches 56a, 56b, and 56c are closed by the accumulation of the encapsulating dielectric material 66, the dielectric material ceases to accumulate on the sidewalls and bottom of the trenches 56a, 56b, and 56c. The thickness of the dielectric material 66 is therefore smaller near the bottom of the trenches 56a, 56b, and 56c than near the top of the trenches 56a, 56b, and 56c. The encapsulating dielectric layer 66 is for example, 20 nm thick on top of the second metal tracks 62a and 62b, and about 10 nm thick on the sidewalls near the bottom of the trenches 56a, 56b, and 56c. The encapsulating dielectric material 66 is, for example, the same material as the dielectric capping layer 42.

The encapsulating dielectric layer 66 as shown in FIG. 8 provides several benefits. The hollow spaces 68 provide air gaps between the conductive plugs 60a and 60b. These air gaps can greatly alleviate capacitance between the conductive plugs 60a and 60b. It is beneficial to reduce the capacitance between conductive plugs and metal interconnections in an integrated circuit die as much as possible except where the capacitance is specifically desired. Capacitance between metal interconnections in an integrated circuit die can cause undesired crosstalk between the metal interconnections. This can cause signals to be erroneously passed through metal interconnections through which they should not be passed. This can also cause an electrical signal to fail to pass through a conductive feature that it should pass through. As two metal structures come closer together, the capacitance between them increases. Thus, as features on an integrated circuit die become smaller and smaller, the capacitance increases because the metal structures become closer and closer to each other. The capacitance between two conductive structures decreases as the dielectric constant of the material between them decreases. Thus, one way to decrease capacitance between metal interconnection structures is to decrease the dielectric constant of the material between them. For this reason, ultra low K dielectric materials are often used as the intermetal dielectric layer between metal layers. Air has an even lower dielectric constant than ultra low K dielectric materials. The dielectric constant of air is approximately 1. Therefore, it can be beneficial to have the space filled with air between the conductive plugs 60a and 60b. This reduces the capacitance between the conductive plugs 60a and 60b, and improves the reliability of the electrical characteristics of the metal interconnecting structures.

A further benefit of having an encapsulating dielectric layer 66 is that the electromagnetic characteristics of the conductive plugs and the metal tracks can be protected. As signals and currents flow through the conductive plugs of an integrated circuit die and metal tracks, there is a risk that the dielectric material surrounding the plugs and metal tracks can deteriorate over time. This problem is most prominent when the dielectric material is an ultra low K dielectric material, which is often the case. As the dielectric material breaks down, metal atoms can diffuse from conductive plugs and metal tracks into dielectric materials. However, because the conductive plugs 60a, 60b and the second metal tracks 62a, 62b of FIG. 8 are encapsulated in the encapsulating dielectric layer 66, this problem of electromigration and dielectric breakdown can be alleviated.

As described previously, the encapsulating dielectric layer 66 is a more robust dielectric material than is commonly used in intermetal dielectric layers. In particular, the encapsulating dielectric layer 66 is made from silicon nitride or another dielectric material, including silicon with nitrogen and carbon. This material is more resistant to breakdown and will not allow electromigration to occur. As will be discussed in further detail below, the second metal tracks 62a, 62b can be completely encapsulated in the encapsulating dielectric layer 66, in an alternative embodiment.

Although not shown in FIG. 8, further metal interconnections can be formed above the second metal tracks 62a, 62b. In particular, a further intermetal dielectric layer can be deposited, wide trenches can be etched therein, conductive material can be deposited therein forming large grains, as described previously, and a conductive material can then be etched to form trenches between interconnect structures. This can be done a number of times for as many metal layers as will be used in the integrated circuit die 30. After this is done, passivation layers and contact pads can be formed on the top of the integrated circuit die 30. Conductive leads, solder balls, or pins can be coupled to the conductive pads to allow electrical connection from outside of the integrated circuit die 30 to the transistors 34 within the integrated circuit die through the metal interconnecting structures. The integrated circuit die 30 can then be encapsulated in a molding compound, or placed in a lead frame, or in any other suitable package configuration to protect the integrated circuit die 30 from further damage. Many other materials and processes can be used in forming an integrated circuit die according to principles of the present disclosure. All such other materials, processes, and dimensions fall within the scope of the present disclosure.

Figure 9:
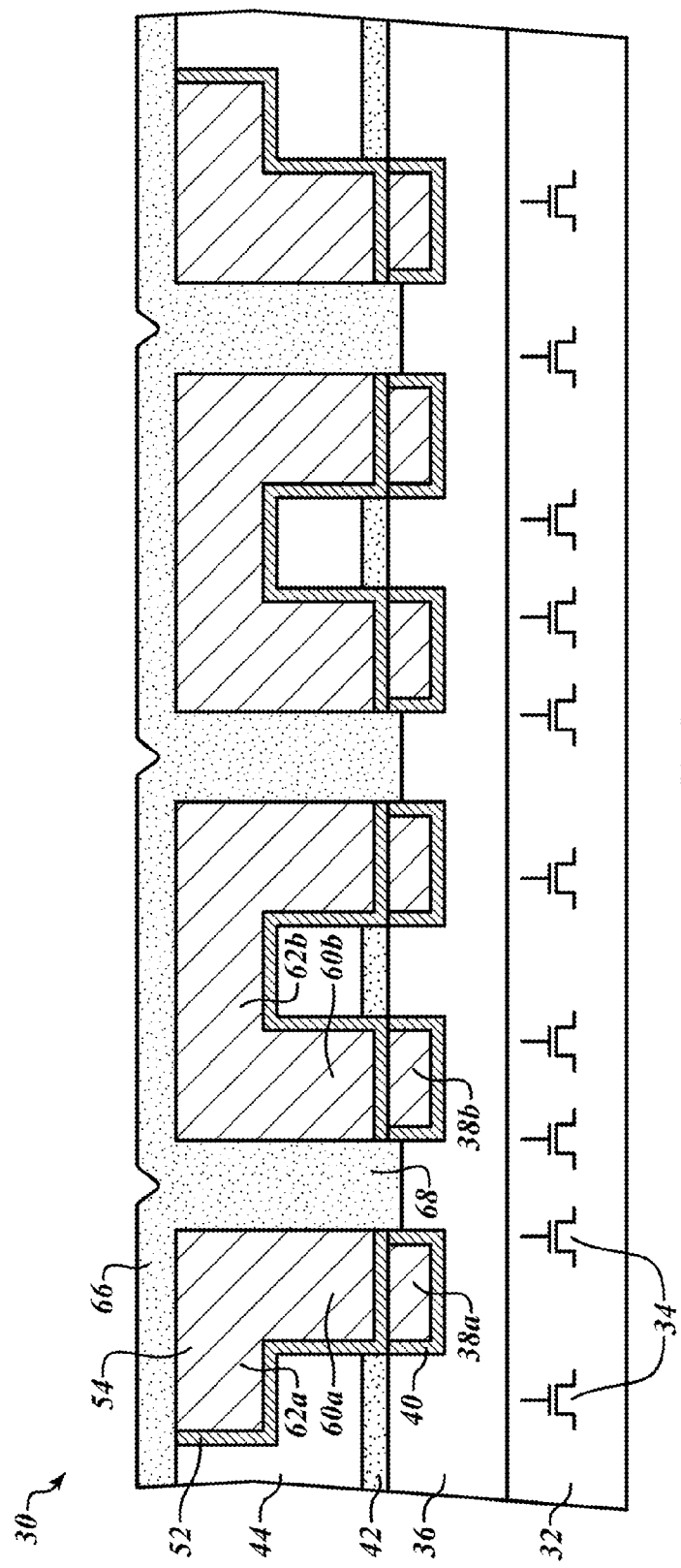
FIG. 9 is a cross section of an integrated circuit die after a protective dielectric layer has been formed on the metal plugs and fills the third trenches according to one embodiment.

FIG. 9 illustrates an integrated circuit die 30 according to one embodiment. The integrated circuit die 30 of FIG. 9 is similar in many regards to the integrated circuit die 30 of FIG. 8, except that the encapsulating dielectric material 66 completely fills the trenches 56a, 56b, and 56c between the conductive plugs. While this does not provide the advantage of having an air gap in the trenches, this may be a more feasible solution for some integrated circuit processes. In some embodiments the trenches 56a, 56b, and 56c may be filled with a dielectric material such as silicon dioxide, a low k dielectric material, or any other suitable dielectric material.

Figure 10A:
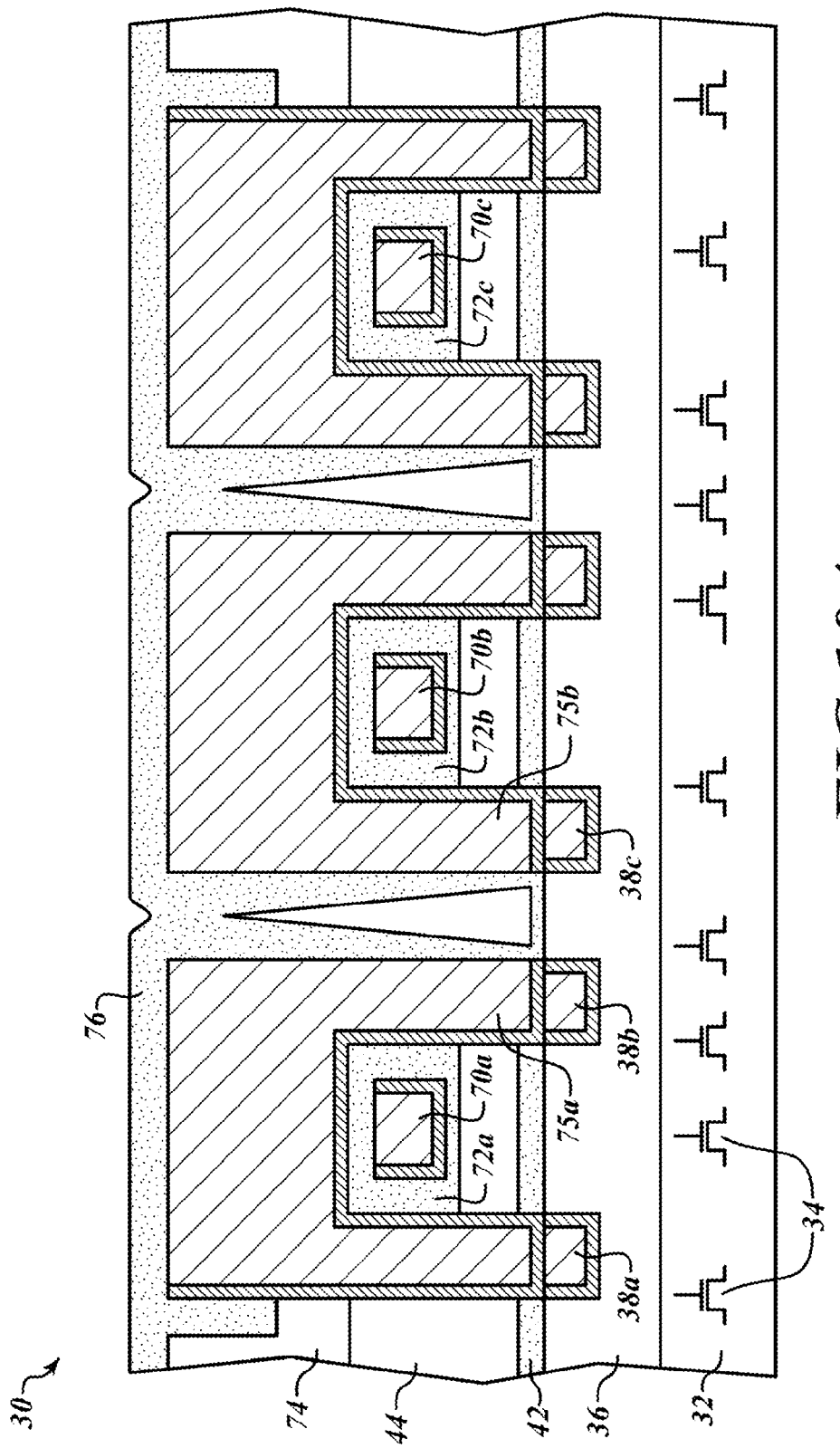
FIG. 10A is a cross section of an integrated circuit die having metal interconnections including double foot branch structures according to one embodiment.

FIG. 10 illustrates an illustrated circuit die 30 according to one embodiment. The integrated circuit die 30 includes first metal tracks 38a, 38b, and 38c as described previously. The integrated circuit die 30 further includes third metal tracks 70a, 70b, and 70c. The third metal tracks 70a, 70b, and 70c are completely encapsulated in an encapsulating dielectric layer 72a, 72b, and 72c. The encapsulating dielectric layer 72a, 72b, and 72c serves as an etch stop for the wide trench etch in which a conductive material will be deposited to form the conductive plugs 75a and 75b illustrated in FIG. 10. Further details regarding forming metal contacts in an integrated circuit die including encapsulating dielectric layers are found in U.S. patent application Ser. Nos. 13/629,411 and 13/629,402 which are incorporated herein by reference in their entireties.

In particular, after formation of the third metal tracks 70a, 70b, and 70c, a third intermetal dielectric layer 74 is formed on top of a second intermetal dielectric layer 44 and the encapsulating dielectric layer 72a, 72b, and 72c. The third intermetal dielectric layer 74 is then patterned and etched to form wide trenches similar to the trenches 48a, 48b, and 48c shown in relation to FIG. 3. Due to the high etch selectivity between the encapsulating dielectric layer 72a and the first and second intermetal dielectric layers 74 and 44, the etch which etches the intermetal dielectric layers 74 and 44 does not etch the encapsulating dielectric layers 72a, 72b, and 72c. Elsewhere, the second intermetal dielectric layer 44 is etched to expose the first metal tracks 38a, 38b, and 38c. The trenches are then filled with conductive material similar to the conductive material 54 as described previously. Trenches are then etched in the conductive material to delineate the first conductive plug 75a from the second conductive plug 75b as well as the other conductive plugs not numbered in FIG. 10. An encapsulating dielectric layer 76 is then formed over the conductive material and in the trenches as described previously.

Further dielectric layers can be formed over the fourth intermetal dielectric layer 90 in accordance with known processes for forming integrated circuit dies. Eventually passivation layers can be formed over the encapsulating dielectric layer 76, contact pads can be formed on the passivation layers to provide connections to the transistors 34 through the metal tracks and vias in the integrated circuit die 30. Finally, the integrated circuit die 30 can be encapsulated in a molding compound and provided with solder balls, leads, or pins coupled to the contact pads so that the integrated circuit die can be installed in an electronic component such as on a circuit board or other suitable location.

Figure 10B:
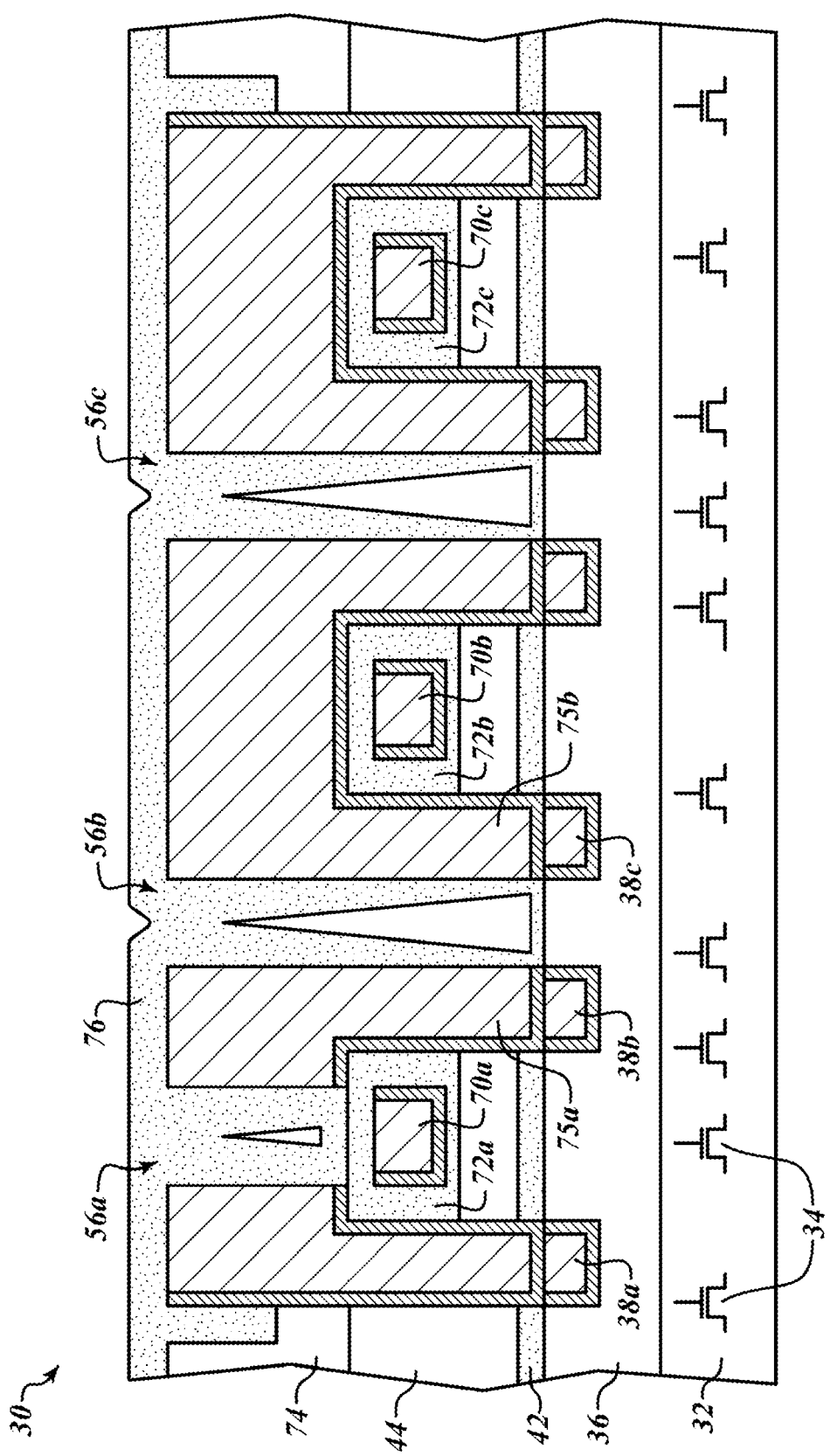
FIG. 10B is a cross section of an integrated circuit die having metal interconnections including double foot branch structures according to an alternative embodiment.

FIG. 10B illustrates an alternative embodiment in which trench 56a is formed over metal track 70a. This illustrates that trenches can be formed in the conductive material in different ways than shown in FIG. 10A. Many other patterns for forming trenches in the conductive material 54 are possible as will be apparent to those of skill in the art in light of the present disclosure.

Many processes and structures for forming an integrated circuit die have not been described in detail in this disclosure. Such other processes and structures are known to those of skill in the art and can be implemented in light of the present disclosure.

The features in the figures are not necessarily drawn to scale. The processes and structures described in relation to FIGS. 1-10B are given by way of example. Other types of materials, thickness, widths, structures and patterns can be used in accordance with principles of the present disclosure. All such alternative embodiments fall within the scope of the present disclosure.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
    forming a first and a second metal track on a substrate;
    forming an intermetal dielectric layer over the first and the second metal tracks;
    forming a first trench exposing the first and the second metal tracks by etching the intermetal dielectric layer;
    depositing a first conductive material in the first trench on the first and the second metal tracks; and
    forming a second trench in the first conductive material by etching the first conductive material, the second trench delineating a first and a second conductive plug from the first conductive material, the first conductive plug being electrically connected to the first metal track, the second conductive plug being electrically connected to the second metal track and electrically isolated from the first conductive plug.

2. The method of claim 1 comprising forming an encapsulating dielectric layer on sidewalls of the second trench and on respective top surfaces of the first and second conductive plugs.

3. The method of claim 2 wherein the encapsulating dielectric layer defines a hollow space in the second trench between the first and second conductive plugs.

4. The method of claim 3 comprising depositing a second intermetal dielectric layer over the first intermetal dielectric layer and the encapsulating dielectric layer, the hollow space in the second trench remaining after depositing the second intermetal dielectric layer.

5. The method of claim 1 wherein the encapsulating dielectric layer includes silicon nitride.

6. The method of claim 1 wherein forming the second trench comprises delineating third and fourth metal tracks from the first conductive material, the first conductive plug electrically coupling the first metal track to the third metal track, the second conductive plug electrically coupling the second metal track to the fourth metal track.

7. The method of claim 1 comprising:
    forming the first intermetal dielectric layer over a second intermetal dielectric layer, the second intermetal dielectric layer being positioned over the first and the second metal tracks;
    forming a third and a fourth metal track on the second intermetal dielectric layer above the first and the second metal tracks; and
    forming the first trench by etching the first and the second intermetal dielectric layers.

8. A method for forming an integrated circuit die, the method comprising:
    forming transistors in a semiconductor substrate;
    forming a first intermetal dielectric layer over the semiconductor substrate;
    forming a plurality of first metal tracks on the first intermetal dielectric layer;
    forming a second intermetal dielectric layer over the first metal tracks and the first intermetal dielectric layer;
    forming a first aperture in the second intermetal dielectric layer exposing the first metal tracks;
    filling the first aperture with a conductive material; and
    defining a first conductive plug and a second conductive plug from the conductive material by etching a second aperture in the conductive material exposing the second intermetal dielectric layer, the first and second conductive plugs being electrically isolated from each other by the second aperture and each being electrically connected to a respective first metal track.

9. The method of claim 8 wherein the conductive material is copper.

10. The method of claim 9 wherein the first and second conductive plugs include large copper grains.

11. The method of claim 8 wherein the second aperture has a width of less than 20 nm.

\* \* \* \* \*